US009038978B1

(12) United States Patent
Campi et al.

(10) Patent No.: US 9,038,978 B1
(45) Date of Patent: May 26, 2015

(54) SUPPORT STAND WITH INTEGRATED FIRE BAFFLE

(75) Inventors: Michael Dean Campi, San Jose, CA (US); Chengwee Lai, Saratoga, CA (US); Bharath Kapnadak, Bangalore (IN); Mruthyunjaya S, Bangalore (IN)

(73) Assignee: Juniper Networks, Inc., Sunnyvale, CA (US)

(*) Notice: Subject to any disclaimer, the term of this patent is extended or adjusted under 35 U.S.C. 154(b) by 154 days.

(21) Appl. No.: 13/246,987

(22) Filed: Sep. 28, 2011

(51) Int. Cl.
*F16M 11/00* (2006.01)
*F16M 11/22* (2006.01)
*H05K 5/02* (2006.01)

(52) U.S. Cl.
CPC .............. *F16M 11/22* (2013.01); *H05K 5/0234* (2013.01); *F16M 2200/08* (2013.01)

(58) Field of Classification Search
CPC ..... F16M 11/22; F16M 2200/08; F16M 9/00; F16M 11/00; F16M 5/00; A47B 91/005; A47B 2023/049; A47B 91/00; H05K 5/0234; H05K 5/0204; G06F 1/20; G06F 1/181; G06F 1/203; B65D 19/38; B65D 19/40; F24F 1/60; F24F 13/32
USPC ............... 248/346.01, 346.03, 146, 154, 676, 248/678, 176.2, 688, 188.1, 188.8; 454/184; D14/447; 361/695, 361/679.48–679.51; 312/236, 223.2
See application file for complete search history.

(56) References Cited

U.S. PATENT DOCUMENTS

| D287,365 S | * | 12/1986 | Judd | D14/447 |
| 4,786,121 A | * | 11/1988 | Lyons | 312/350 |
| 4,949,934 A | * | 8/1990 | Krenz et al. | 361/679.46 |
| D330,021 S | * | 10/1992 | Kline et al. | D14/447 |
| 5,192,046 A | * | 3/1993 | Howard | 248/676 |
| D338,882 S | * | 8/1993 | Reiter | D14/447 |
| 5,263,668 A | * | 11/1993 | Reiter | 248/346.01 |
| 5,295,648 A | * | 3/1994 | Hames | 248/149 |
| D362,245 S | * | 9/1995 | Moffatt | D14/447 |
| 6,059,384 A | * | 5/2000 | Ho | 312/223.2 |
| 6,193,208 B1 | * | 2/2001 | Schmitt et al. | 248/688 |
| D458,269 S | * | 6/2002 | Goto | D14/447 |
| 6,805,327 B1 | * | 10/2004 | Shen | 248/346.07 |
| 6,836,405 B2 | * | 12/2004 | Alfonso et al. | 361/679.58 |
| 6,875,101 B1 | * | 4/2005 | Chien | 454/184 |
| 6,923,414 B2 | * | 8/2005 | Shida et al. | 248/346.07 |
| D540,328 S | * | 4/2007 | Hussaini et al. | D14/434 |
| 7,315,447 B2 | * | 1/2008 | Inoue et al. | 361/679.48 |
| 7,392,968 B2 | * | 7/2008 | Ke | 248/346.01 |
| D579,455 S | * | 10/2008 | Chu | D14/447 |
| 7,450,371 B2 | * | 11/2008 | Searby | 361/679.55 |
| 7,527,228 B2 | * | 5/2009 | Chung | 248/154 |
| 7,891,635 B2 | * | 2/2011 | Rowland | 248/678 |
| D637,600 S | * | 5/2011 | Leyva-Menendez | D14/447 |
| 8,113,478 B2 | * | 2/2012 | Hsiao | 248/346.03 |
| 8,220,768 B1 | * | 7/2012 | Cantolino | 248/636 |
| 2006/0081752 A1 | * | 4/2006 | Ke | 248/346.01 |
| 2007/0001082 A1 | * | 1/2007 | Prokop | 248/346.01 |
| 2007/0133167 A1 | * | 6/2007 | Wagner et al. | 361/687 |
| 2008/0029684 A1 | * | 2/2008 | Rowland | 248/678 |
| 2011/0248136 A1 | * | 10/2011 | Shen | 248/300 |
| 2011/0284711 A1 | * | 11/2011 | Hsiao | 248/346.03 |

* cited by examiner

*Primary Examiner* — Ingrid M Weinhold
(74) *Attorney, Agent, or Firm* — Harrity & Harrity, LLP

(57) ABSTRACT

A system includes a device chassis and a base. The base includes a first section on a first side of the base, a second section on a second side of the base, and a middle section between the first section and the second section. The middle section is arranged above the first section and the second section. The device chassis attaches to the middle section, and a space is provided between the middle section and the device chassis.

20 Claims, 9 Drawing Sheets

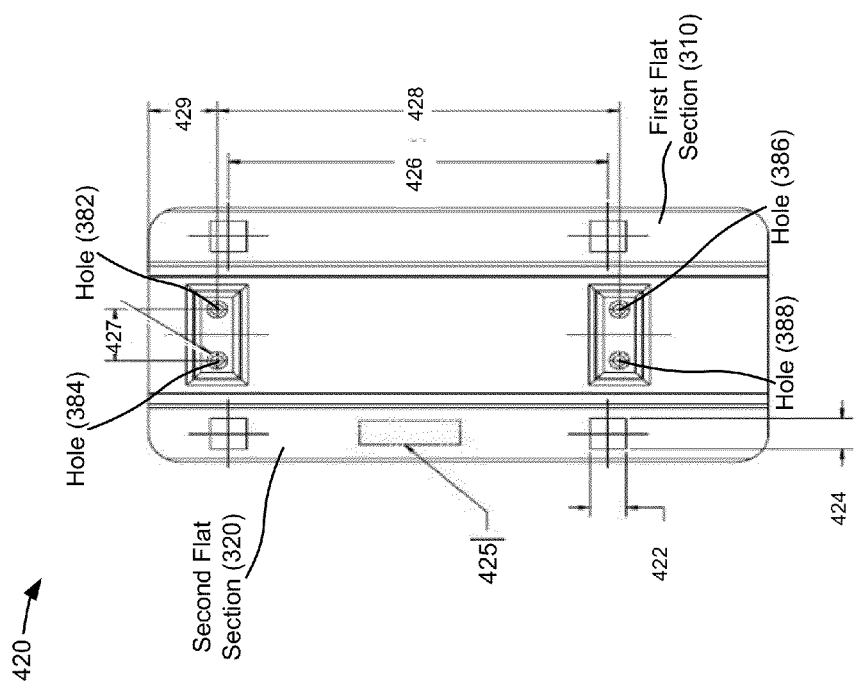

US 9,038,978 B1

SUPPORT STAND WITH INTEGRATED FIRE BAFFLE

BACKGROUND

Some network devices (e.g., routers) are designed to be placed on top of desks. In order to reduce a footprint of a network device on a desk, a user may place the networking device on its smallest side on the desk. Such a position may be unstable for the network device. Furthermore, the position may violate bottom fire opening requirements of regulatory safety standards. One solution, to overcome the regulatory safety standards issue, is to place a metal screen on an inside of vents of the networking device. However, an electrical short could occur in the network device if the screen comes loose. Another solution, to overcome the regulatory safety standards issue, is to redesign the vents of the network device in order to meet bottom fire opening requirements. The network device with the redesigned vents would increase an amount of volumetric space utilized by the network device.

Both solutions require additional costs, for design and implementation, and reduce air flow of the network device. The reduced air flow can cause increased heating of the network device and, thus, reduces reliability of the network device. Additionally, neither solution provides stability for the network device in order for the network device to maintain a vertical orientation, while placed on its smallest side on top of a desk.

SUMMARY

According to one aspect, a system may include a device chassis and a base. The base may include a first section on a first side of the base, a second section on a second side of the base, and a middle section provided between and connected to the first section and the second section. The device chassis may attach to the middle section. A space may be provided between the middle section and the device chassis. The middle section may be provided above than the first section and the second section.

According to another aspect, a base, for a device chassis, may include a middle section attached to a small side of the device chassis, a first side section on a first side of the middle section, and a second side section on a second side of the middle section. The middle section may be provided above the first side section and the second side section when the base is placed on a horizontal surface. A space may be provided between the middle section and the small side of the device chassis.

According to yet another aspect, a support stand may include a middle section; a first side section connected to the middle section; and a second side section connected to the middle section on an opposite side from the first side section. The middle section may include at least one raised portion that is attachable to a device chassis and creates a space between the device chassis and the middle section. The middle section may be arranged above the first side section and the second side section. A space may be provided between the middle section and the device chassis by the at least one raised portion.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIGS. 4A-4E illustrate example dimensions of an example base.

DETAILED DESCRIPTION

The following detailed description refers to the accompanying drawings. The same reference numbers in different drawings may identify the same or similar elements.

An implementation, described herein, may provide a base for a device chassis (e.g., of a network device). The base may simultaneously act as a support stand for the device chassis and as an integrated fire baffle for the device chassis. The base may include a middle section and two side sections. The middle section may be above the two side sections when the base is (i.e., the two side sections are) placed on top of a surface, such as the surface of the desk. The middle section may attach to a small side of the device chassis. The base may provide stability for the device chassis, may maintain the device chassis in a vertical orientation, and may permit the device chassis to occupy minimal space on the surface. The base may also catch molten particles generated by the device chassis, and may prevent the molten particles from igniting the surface.

Figure 1A:
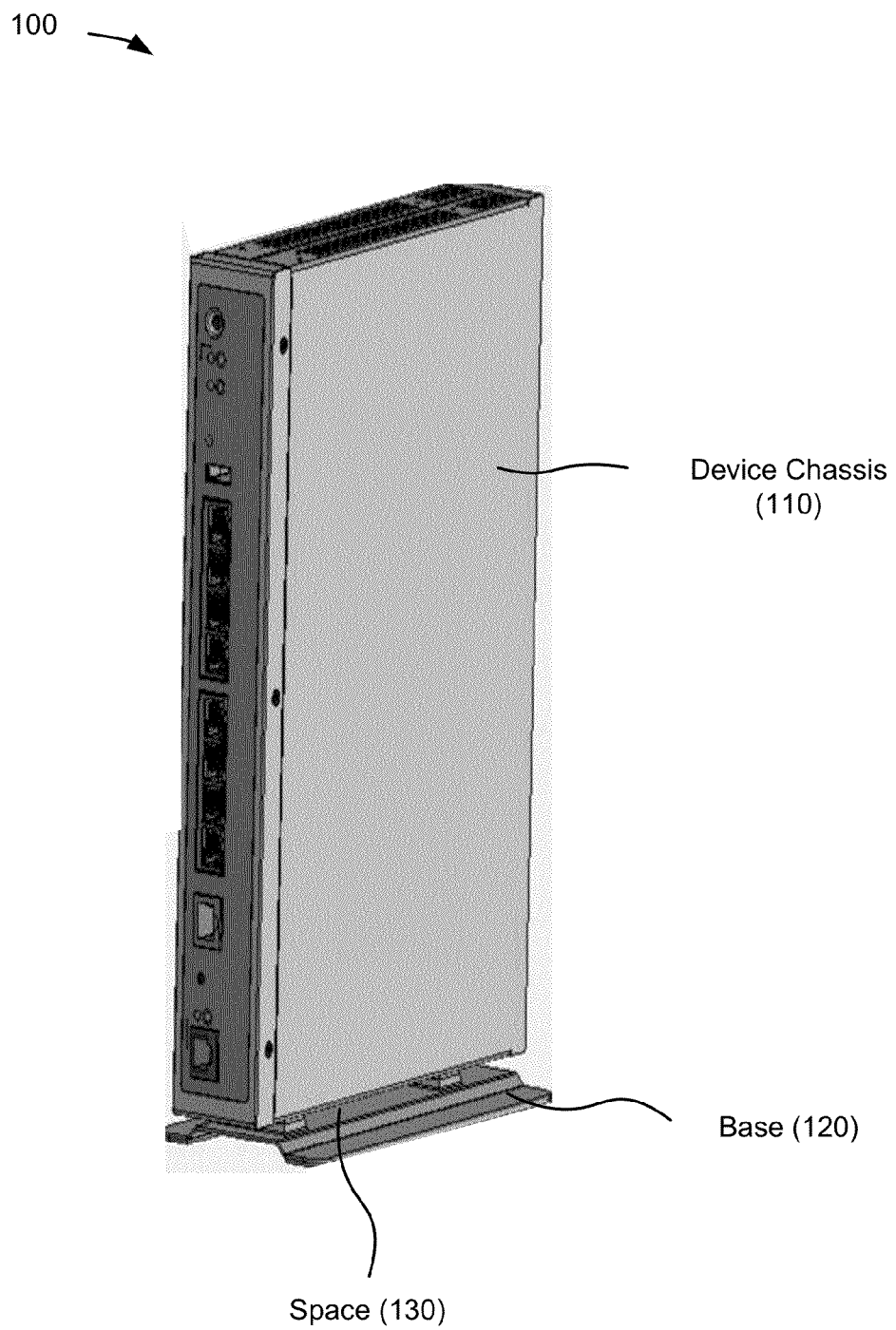
FIGS. 1A and 1B are diagrams illustrating an isometric view and a side view, respectively, of an example system in which an example base or support stand with integrated fire baffle described herein may be implemented.
Figure 1B:
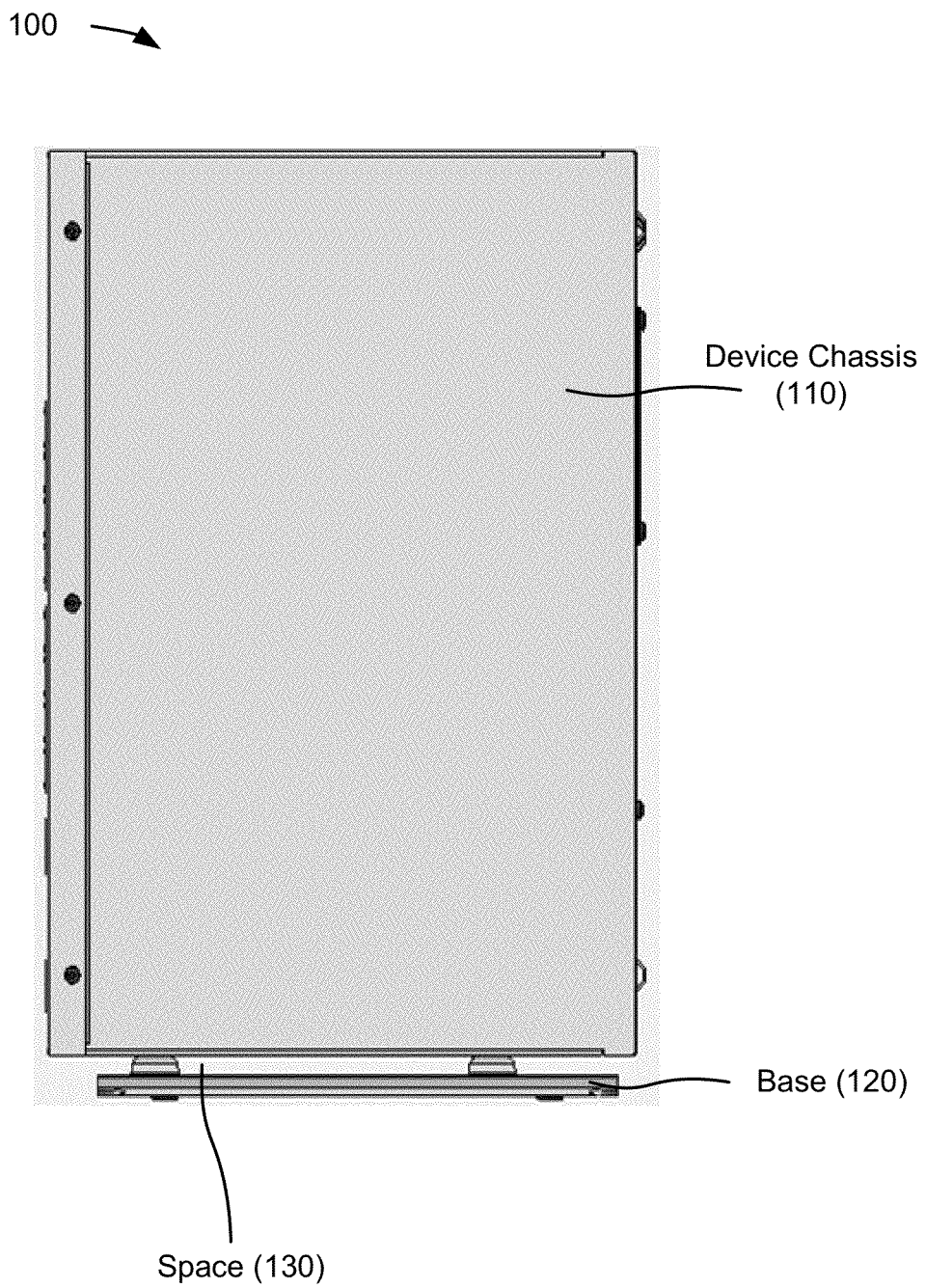

FIGS. 1A and 1B are diagrams illustrating an isometric view and a side view, respectively, of an example system 100 in which an example support stand with integrated fire baffle described herein may be implemented. As shown in FIGS. 1A and 1B, system 100 may include a device chassis 110, a base 120, and a space 130.

Device chassis 110 may include a chassis that houses one or more network devices (e.g., routers, gateways, switches, firewalls, network interface cards (NICs), hubs, bridges, proxy servers, or some other type of devices that may process and/or transfer data), one or more computation or communication devices (e.g., personal computers, work stations, server devices, etc.), and/or any other devices capable of being placed on a horizontal surface (e.g., on a top surface of a desk, table, etc.). In one implementation, device chassis 110 may include additional components (e.g., cables, connectors, etc.) depending upon the function of device chassis 110. Device chassis 110 may be sized and/or shaped to accommodate the one or more devices and/or components housed within device chassis 110, and the size and/or shape of device chassis 110 may depend on the number, size, and/or shape of the devices and/or components housed within device chassis 110. Device chassis 110 may include six different sides, including two smallest sides of equal size and on opposite ends of device chassis 110. One of the two smallest sides may be placed on top of and attached to base 120.

Base 120 may act as a support stand with an integrated fire baffle. In one example implementation, a width of base 120 may be at least twice the size of a width of device chassis 110. Base 120 may be manufactured from a variety of materials. For example, base 120 may be made from a single sheet of stamped sheet metal. Base 120 (and/or the single sheet) may be composed of hot-dipped, zinc-coated, galvanized commercial steel, a thermoplastic material, and/or any other rigid, non-flammable material.

Base 120 may provide stability for device chassis 110 so that device chassis 110 may be maintained in a vertical orientation when device chassis 110 is placed on one of its two smallest sides. Base 120 may act as a fire baffle by catching molten particles if such particles are generated by device chassis 110 or components within device chassis 110. As a result, base 120 may prevent the molten particles from igniting any flammable material under device chassis 110 and base 120 (e.g., the horizontal surface). Accordingly, base 120 may allow system 100 to meet applicable regulatory safety standards associated with preventing fires.

Base 120 may also provide/allow additional air flow around device chassis 110 via space 130. Space 130 may be formed between device chassis 110 and base 120 when device chassis 110 is attached to base 120. The additional air flow may reduce heating of system 100, particularly device chassis 110, and, accordingly, may increase the reliability of device chassis 110.

Although FIGS. 1A and 1B show example components of system 100, in other implementations, system 100 may contain fewer components, different components, differently arranged components, and/or additional components than those depicted in FIGS. 1A and 1B. In still other implementations, one or more components of system 100 may perform one or more other tasks described as being performed by one or more other components of system 100.

Figure 2:
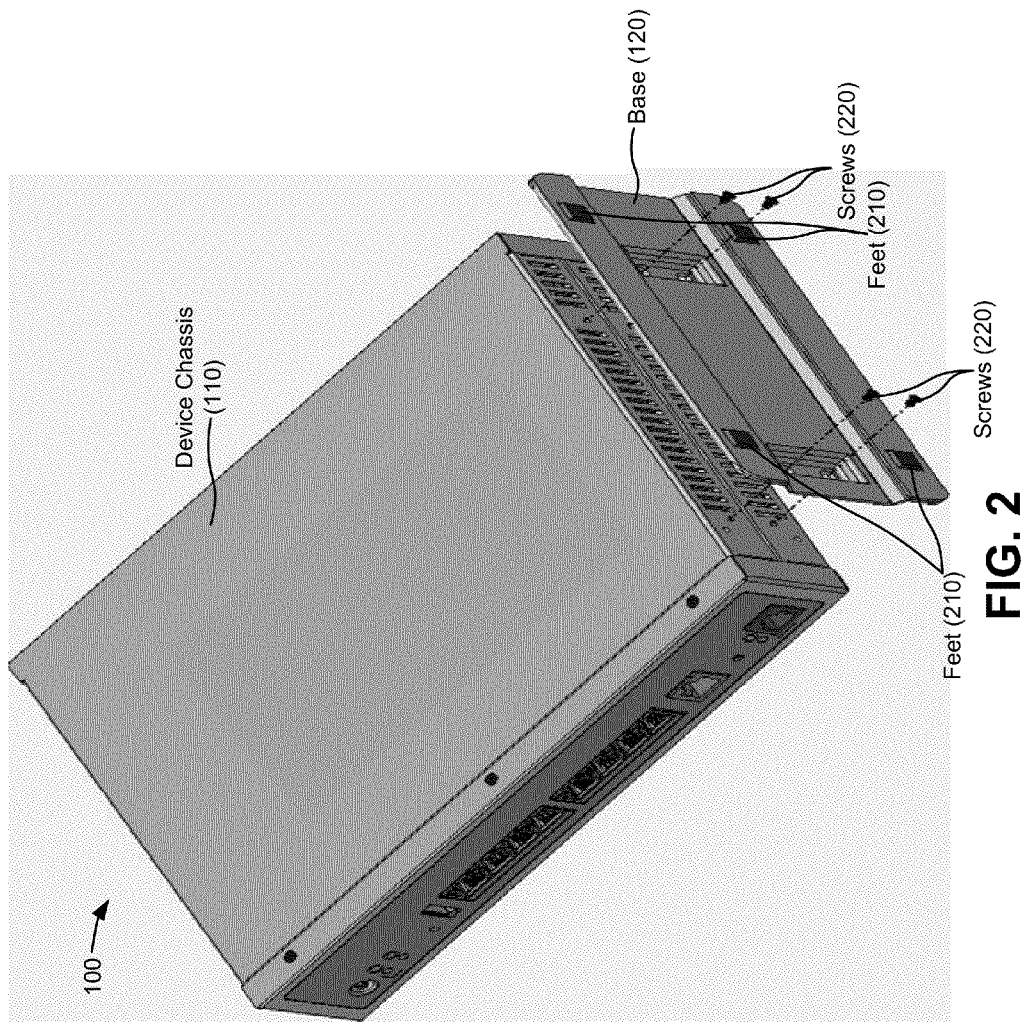
FIG. 2 is a diagram illustrating an exploded view of a device chassis and the base.

FIG. 2 is a diagram illustrating an exploded view of device chassis 110 and base 120. As shown in FIG. 2, base 120 may include feet 210. Feet 210 may be attached to base 120 in variety of ways, such as via an adhesive. Feet 210 may be made from a material that prevents base 120 from sliding from a particular position on the horizontal surface. For example, feet 210 may include a material (e.g., rubber, a thermoplastic, etc.) that frictionally engages the horizontal surface to prevent base 120 from sliding. The particular position may be selected by a user who places system 100 (i.e., device chassis 110 and bases 120) in the particular position. Feet 210 may provide stability to system 100 by preventing device chassis 110 from falling (e.g., due to a movement of base 120). Although FIG. 2 shows four feet 210, in other implementations base 120 may include more or less feet 210.

As further shown in FIG. 2, a user may use a particular quantity (e.g., four) screws 220 to attach base 120 to device chassis 110 via holes provided in base 120 and holes provided in device chassis 110. The holes provided in device chassis 110 may be standard components of device chassis 110, and may not need to be added in order to attach base 120 to device chassis 110 with screws 220. Although FIG. 2 shows four screws 220, in other implementations more or less screws 220 may be used to attach device chassis 110 to base 120. Furthermore, although FIG. 2 shows screws 220, in other implementations other types of connection mechanisms, instead of or in addition to screws 220, may be used in order to attach base 120 to device chassis 110. The other types of connection mechanisms may include, for example, one or more of bolts, welding, glue, etc.

Figure 3:
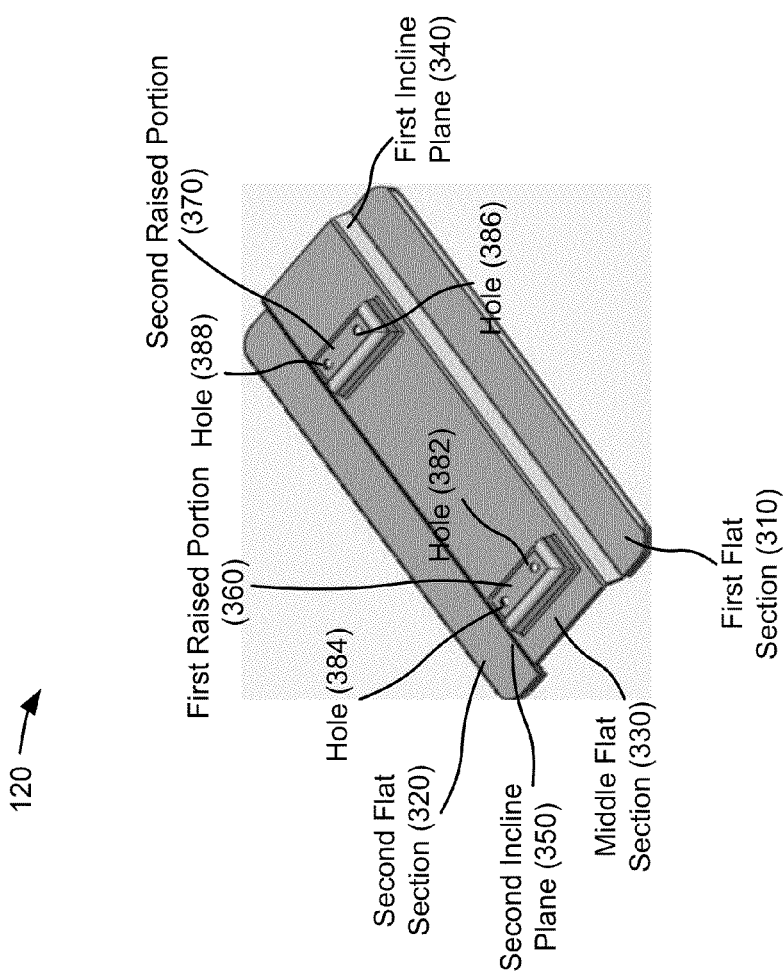
FIG. 3 is a diagram illustrating an isometric view of the base depicted in FIGS. 1A-2.

FIG. 3 is a diagram illustrating an isometric view of base 120. As shown in FIG. 3, base 120 may include a first flat section 310, a second flat section 320, a middle flat section 330, a first incline plane 340, a second incline plane 350, a first raised portion 360, a second raised portion 370, and multiple holes 382-388 provided in raised portions 360 and 370. A top surface of first flat section 310, a top surface of first incline section 340, a top surface of middle flat section 330, a top surface of second incline plane 350, and a top surface of second flat section 320 may be continuous.

First flat section 310 and second flat section 320 may engage a horizontal surface on which base 120 is placed. Dimensions (e.g., height, width, length, etc.) of first flat section 310 may be similar to the dimensions of second flat section 320. Middle flat section 330 may be arranged at a first height above first flat section 310 and second flat section 320. First incline plane 340 may connect first flat section 310 and middle flat section 330. Second incline plane 350 may connect second flat section 320 and middle flat section 330. Dimensions (e.g., angle, height, width, length, etc.) of first incline plane 340 may be similar to the dimensions of second incline plane 350.

Middle flat section 330 may include first raised portion 360 and second raised portion 370. A first indentation on a bottom surface of middle flat section 330 may form first raised portion 360 (e.g., as shown in FIG. 4E). First raised portion 360 may protrude above the top surface of middle flat section 330. And, a second indentation on the bottom surface of middle flat section 330 may form second raised portion 370. Second raised portion 370 may protrude above the top surface of middle flat section 330. Dimensions of first raised portion 360 may be similar to the dimensions of second raised portion 370. Each of first raised portion 360 and second raised portion 370 may protrude a second height above a surface of middle flat section 330. In one example, a width of first flat section 310 and of flat section 320 may be at least twice as long as the second height, as shown in FIGS. 4A-4E.

First raised portion 360 may include holes 382 and 384. Second raised portion 370 may include holes 386 and 388. Screws 220 (FIG. 2) may placed via holes 382-388 into the existing holes of device chassis 110 in order to attach device chassis 110 and base 120. Each one of holes 382-388 may have similar dimensions (e.g., radii). When device chassis 110 is attached to base 120, raised portions 360 and 370 may create space 130 (FIGS. 1A and 1B) between device chassis 110 and middle flat section 330 of base 120.

Although FIG. 3 shows example components of base 120, in other implementations, base 120 may contain fewer components, different components, differently arranged components, and/or additional components than those depicted in FIG. 3. In one example implementation, components of base 120 may be sized and shaped depending on the size and shape of device chassis 110. For example, if device chassis 110 is larger in size, the sizes and/or shapes of the components of base 120 may be larger. In another example, if device chassis 110 is smaller in size, the sizes and/or shapes of the components of base 120 may be smaller.

FIGS. 4A-4E illustrate example dimensions of base 120. While certain dimensions are described below in terms of particular measurements (e.g., millimeters (mm), degrees, etc.), these dimensions are merely provided as examples. Some of these dimensions are provided to illustrate relationships between the dimensions and/or proportions of different components. For example, the width of first flat section 310 (and of second flat section 320) may be at least twice the size of a height of first raised portion 360 (and of second raised portion 370).

Figure 4A:
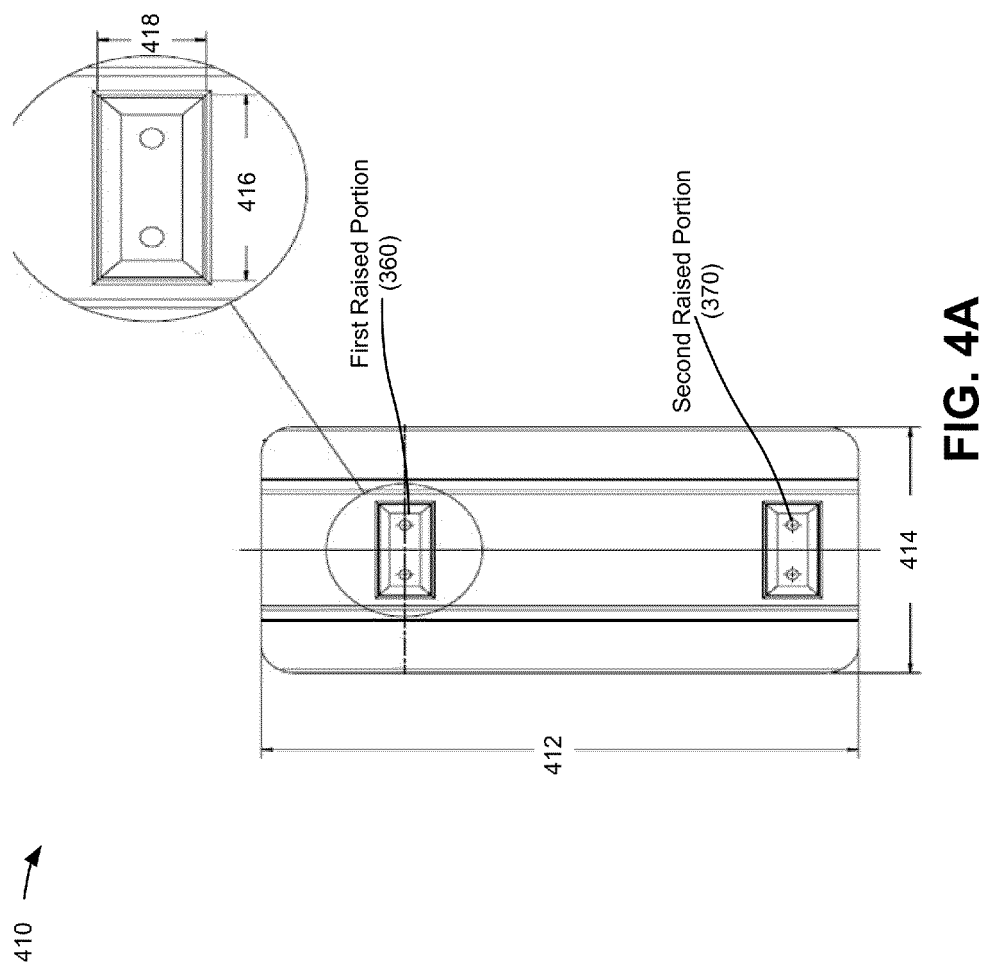

FIG. 4A illustrates an example top view 410 of base 120. As shown in FIG. 4A, base 120 may include a length 412 and a width 414. In one example, length 412 of base 120 may equal 185 mm. In another example, width 414 of base 120 may equal 89.6 mm. First raised portion 360 (and second raised portion 370) may include a length 416 and a width 418. In one example, length 416 of first raised portion 360 (and of second raised portion 370) may equal 33.8 mm. In another example, width 418 of first raised portion 360 (and of second raised portion 370) may equal 16.8 mm.

FIG. 4B illustrates an example bottom view 420 of base 120. As shown in FIG. 4B, first flat section 310 (or second flat section 320) of base 120 may include a field 425 to place an identification number of base 120. The identification number may identify a type of part associated with base 120. In one implementation, the manufacturer may use indelible ink to place the identification number in field 425. In another implementation, the manufacturer may stamp the identification number into field 425 of first flat section 310 (or of second flat section 320).

As further shown in FIG. 4B, each one of feet 210 may include a length 422 and a width 424. In one example, length 422 of each one of feet 210 (FIG. 2) may equal 10.8 mm. In another example, width 424 of each one of feet 210 may also equal 10.8 mm.

As also shown in FIG. 4B, base 120 may include a distance 426 between the two feet 210 of first flat section 310. In one example, distance 426 may equal 113.2 mm. A distance between the two feet 210 of second flat section 320 may also equal 113.2 mm.

Base 120 may further include a distance 427 between a center of hole 382 and a center of hole 384 and a distance 428 between the center of hole 382 and the center of hole 386. In one example, distance 427 may equal 18 mm. A distance between a center of hole 386 and a center of hole 388 may also equal 18 mm. In another example, distance 428 may equal 120 mm. A distance between the center of hole 384 and the center of hole 388 may also equal 120 mm.

Base 120 may also include a distance 429 between the center of hole 382 and an edge of base 120. In one example, distance 429 may equal 20.5 mm. A distance between the center of hole 384 and the edge of base 120 may also equal 20.5 mm. In another example, a distance between the center of hole 386 (and/or the center of hole 388) and an opposite edge of base 120 may also equal 20.5 mm.

Figure 4C:
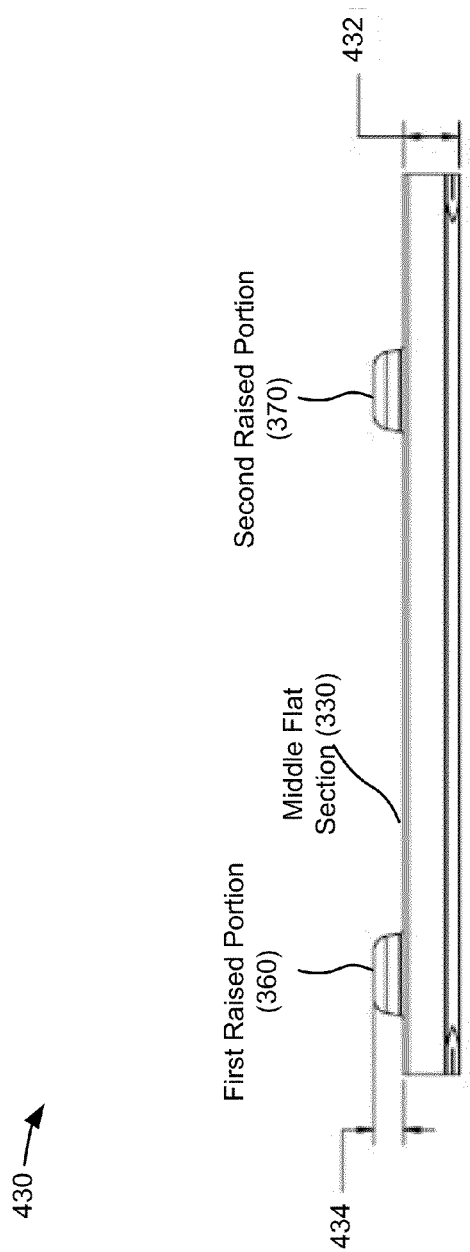

FIG. 4C illustrates a side view 430 of base 120. As show in FIG. 4C, middle flat section 330 may include a height 432. In one example, height 432 may equal 11.3 mm. As further shown in FIG. 4C, first raised portion 360 (and second raised portion 370) may include a height 434. In one example, height 434 may equal 6 mm.

Figure 4D:
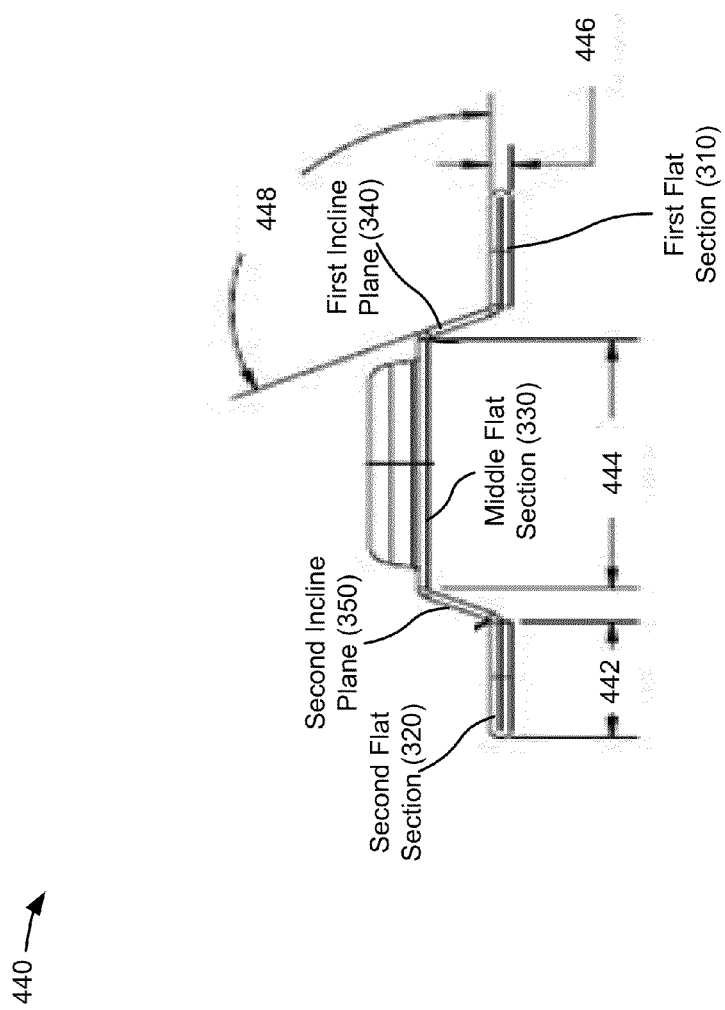
Figure 4E:
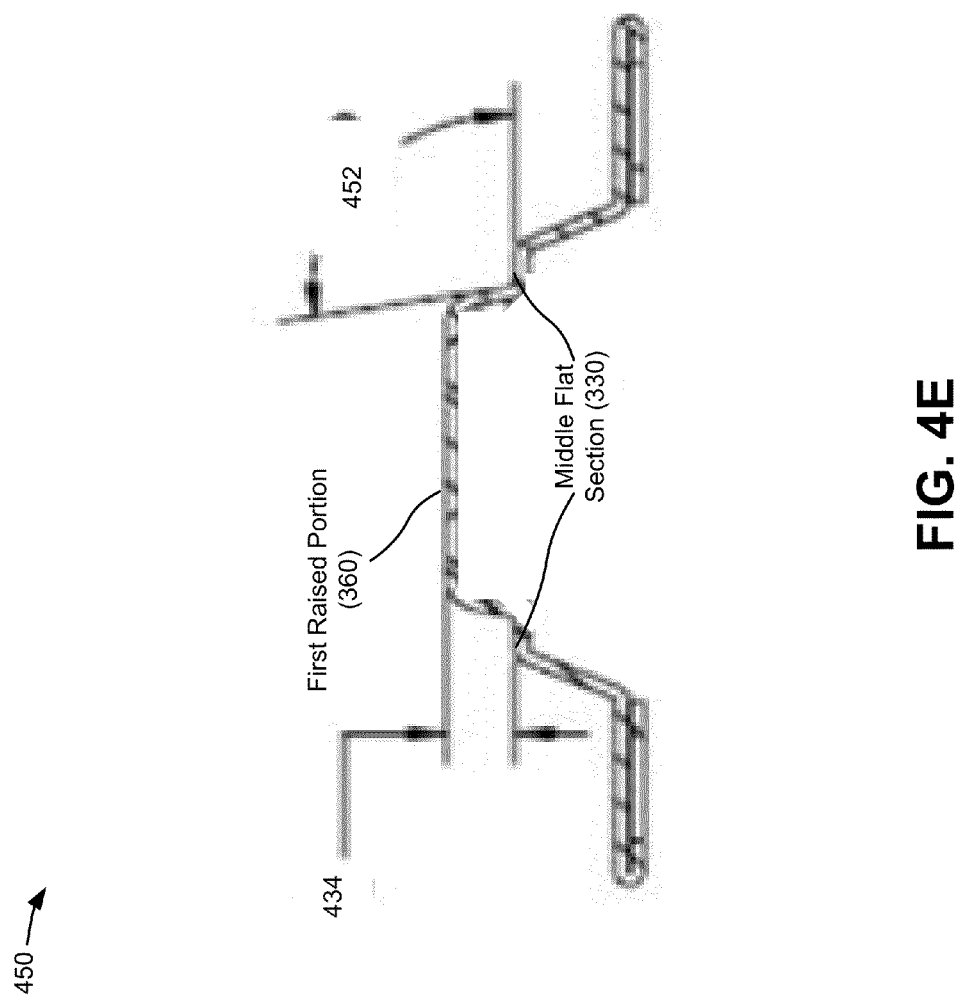

FIG. 4D illustrates a front view 440 of base 120. As shown in FIG. 4D, second flat section 320 (and first flat section 310) may include a width 442. In one example, width 442 may equal 19 mm. As further shown in FIG. 4D, middle flat section 330 may include a width 444. In one example, width 444 may equal 40.7 mm.

As also shown in FIG. 4D, first flat section 310 (and second flat section 320 and/or middle flat section 330) may include a thickness 446. In one example, thickness 446 may equal a thickness of the sheet metal used to manufacture base 120. In another example, thickness 446 and/or the thickness of the sheet metal may equal 2.5 mm.

As also shown in FIG. 4D, base 120 may include an angle 448 between first flat section 310 and first incline plane 340 (and between second flat section 320 and second incline plane 350). In one example, angle 448 may equal 115 degrees.

FIG. 4E illustrates a cross-section view 450 of base 120. As shown in FIG. 4E, base 120 may include an angle 452 between middle section 330 and either side of first raised section 360. In one example, angle 452 may equal 100 degrees. An angle between middle section 330 and either side of second raised section 370 may also equal 100 degrees.

And, as also described above in reference to FIG. 4C, height 434 of first raised section 360 (and of second raised section 370) may equal 6 mm.

The foregoing description of implementations provides illustration and description, but is not intended to be exhaustive or to limit the implementations to the precise form disclosed. Modifications and variations are possible in light of the above teachings or may be acquired from practice of these implementations.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:
1. A system comprising:
 a base comprising:
  a first flat section on a first side of the base,
   a bottom surface of the first flat section being configured to be placed on a horizontal surface,
  a second flat section on a second side of the base,
   a bottom surface of the second flat section being configured to be placed on the horizontal surface,
  a middle section provided between the first flat section and the second flat section,
  a first incline section that connects the first flat section and the middle section, and
  a second incline section that connects the second flat section and the middle section,
   a top surface of the first flat section, a top surface of the first incline section, a top surface of the middle section, a top surface of the second incline section, and a top surface of the second flat section being continuous,
   the middle section including:
    a first indentation on a bottom surface of the middle section that forms a first raised portion that protrudes above the top surface of the middle section, and
    a second indentation on the bottom surface of the middle section that forms a second raised portion that protrudes above the top surface of the middle section,
   the middle section being configured to form a first space between the middle section and a device chassis when the first raised portion and the second raised portion are attached to the device chassis,
   the middle section being provided above the first flat section and the second flat section,
   the base being configured to form a second space when the base is placed on top of the horizontal surface,
   the second space extending from the middle section to the horizontal surface and extending from the first flat section to the second flat section, and the base being made from a single sheet of stamped sheet metal.

2. The system of claim 1, where the base is made from non-flammable material.

3. The system of claim 1, further comprising:
first feet that are attached to the bottom surface of the first flat section, and
second feet that are attached to the bottom surface of the second flat section.

4. The system of claim 1,
where the first space is further formed between the first raised portion and the second raised portion.

5. The system of claim 1, where a width of the first flat section is equal to at least twice a height of the first raised portion.

6. The system of claim 1,
where the first raised portion comprises a first hole and a second hole, and
where the second raised portion comprises a third hole and a fourth hole.

7. The system of claim 6, further comprising:
a first screw that attaches the first raised portion to the device chassis via the first hole,
a second screw that attaches the first raised portion to the device chassis via the second hole,
a third screw that attaches the second raised portion to the device chassis via the third hole, and
a fourth screw that attaches the second raised portion to the device chassis via the fourth hole.

8. The system of claim 6,
where the system further comprises the device chassis,
where the device chassis comprises existing holes,
the existing holes including a first existing hole, a second existing hole, a third existing hole, and a fourth existing hole, and
where the device chassis is attached to the first raised portion and the second raised portion by connecting the first existing hole to the first hole via the first screw, the second existing hole to the second hole via the second screw, the third existing hole to the third hole via the third screw, and the fourth existing hole to the fourth hole via the fourth screw.

9. The system of claim 1,
where the system further comprises the device chassis, and
where the device chassis comprises a chassis for at least one of a router or a server.

10. A base, for a device chassis, comprising:
a middle section;
a first flat section on a first side of the middle section,
a bottom surface of the first flat section being configured to be placed on a surface;
a first incline section that connects the first flat section and the middle section;
a second flat section on a second side of the middle section,
a bottom surface of the second flat section being configured to be placed on the surface; and
a second incline section that connects the second flat section and the middle section,
a top surface of the first flat section, a top surface of the first incline section, a top surface of the middle section, a top surface of the second incline section, and a top surface of the second flat section being continuous,
the middle section being provided above the first flat section and the second flat section,
the middle section including:
a first indentation on a bottom surface of the middle section that forms a first raised portion that protrudes above the top surface of the middle section, and
a second indentation on the bottom surface of the middle section that forms a second raised portion that protrudes above the top surface of the middle section,
the middle section being configured to form a first space between the middle section and a side of a device chassis when the first raised portion and the second raised portion are attached to the side of the device chassis,
the base being configured to form a second space when the base is placed on top of the surface,
the second space extending from the middle section to the surface and extending from the first flat section to the second flat section, and
the base being made from a single sheet of stamped sheet metal.

11. The base of claim 10, where the first space is further formed between the first raised portion and the second raised portion.

12. The base of claim 10,
where a first screw attaches the first raised portion to the side of the device chassis via a first hole of the first raised portion, and
where a second screw attaches the second raised portion to the side of the device chassis via a second hole of the second raised portion.

13. The base of claim 10, where a width of the first side section is equal to at least twice a height of the first raised portion.

14. The base of claim 10, further comprising:
first feet that are attached to the bottom surface of the first flat section, and
second feet that are attached to the bottom surface of the second flat section.

15. The base of claim 14, where the first feet frictionally engage the surface to prevent the base from sliding.

16. A support stand comprising:
a middle section comprising:
a first indentation on a bottom surface of the middle section that forms a first raised portion that protrudes above a top surface of the middle section, and
a second indentation on the bottom surface of the middle section that forms a second raised portion that protrudes above the top surface of the middle section,
a first flat section,
a bottom surface of the first flat section being configured to be placed on a surface,
a first incline section that connects the first flat section and the middle section,
a second flat section,
a bottom surface of the second flat section being configured to be placed on the surface,
a second incline section that connects the second flat section and the middle section,
a top surface of the first flat section, a top surface of the first incline section, a top surface of the middle section, a top surface of the second incline section, and a top surface of the second flat section being continuous,
the middle section being arranged above the first flat section and the second flat section, the middle section being configured to form a first space between the middle section and a device chassis when the first raised portion and the second raised portion are attached to the device chassis, the base being configured to form a second space that extends from the middle section to the surface and that extends from the first side section to the second side section when the base is placed on top of the surface, and the base being made from a single sheet of stamped sheet metal.

17. The support stand of claim 16, where:

the first raised portion comprises a first hole and a second hole, and the second raised portion comprises a third hole and a fourth hole.

18. The support stand of claim 17, where:

a first screw attaches the first raised portion to the device chassis via the first hole, a second screw attaches the first raised portion to the device chassis via the second hole, a third screw attaches the second raised portion to the device chassis via the third hole, and a fourth screw attaches the second raised portion to the device chassis via the fourth hole.

19. The support stand of claim 16, where a width of the first raised portion is greater than a length of the first raised portion.

20. The support stand of claim 16, where the first space is further formed between the first raised portion and the second raised portion.

\* \* \* \* \*